United States Patent
Goldsmith (10) Patent No.: US 9,733,287 B2
(45) Date of Patent: Aug. 15, 2017

(54) DISTRIBUTED CONTROL SYSTEM FOR PARALLEL-CONNECTED DC BOOST CONVERTERS

(71) Applicant: Steven Goldsmith, Minneapolis, MN (US)

(72) Inventor: Steven Goldsmith, Minneapolis, MN (US)

(73) Assignee: MICHIGAN TECHNOLOGICAL UNIVERSITY, Houghton, MI (US)

( * ) Notice: Subject to any disclaimer, the term of this patent is extended or adjusted under 35 U.S.C. 154(b) by 558 days.

(21) Appl. No.: 14/215,373

(22) Filed: Mar. 17, 2014

(65) Prior Publication Data
US 2014/0365147 A1    Dec. 11, 2014

Related U.S. Application Data

(60) Provisional application No. 61/794,484, filed on Mar. 15, 2013.

(51) Int. Cl.
*H02J 1/00*    (2006.01)
*H02J 1/10*    (2006.01)
*H02J 1/12*    (2006.01)
*G01R 21/133*  (2006.01)

(52) U.S. Cl.
CPC .............. *G01R 21/133* (2013.01); *H02J 1/10* (2013.01)

(58) Field of Classification Search
CPC ... G01R 21/133; H02J 1/00; H02J 1/10; H02J 1/12
See application file for complete search history.

(56) References Cited

PUBLICATIONS

Wilson et al., Renewable Energy Microgrid Control with Energy Storage Integration, 2012 International Symposium on Power Electronics, Electrical Drives, Automation and Motion, pp. 158-163.*
Luo, Z. Ye, et al; A Classification and Evaluation of Paralleling Methods for Power Supply Modules; IEEE Power Electronics Specialists Conference, PESC '99 Conf. Rec., June . . . , 2 pp.

(Continued)

*Primary Examiner* — Toan Le
(74) *Attorney, Agent, or Firm* — Adams Grumbles, LLP; Paul Feng; Brittany Nanzig (57) ABSTRACT

The disclosed invention is a distributed control system for operating a DC bus fed by disparate DC power sources that service a known or unknown load. The voltage sources vary in v-i characteristics and have time-varying, maximum supply capacities. Each source is connected to the bus via a boost converter, which may have different dynamic characteristics and power transfer capacities, but are controlled through PWM. The invention tracks the time-varying power sources and apportions their power contribution while maintaining the DC bus voltage within the specifications. A central digital controller solves the steady-state system for the optimal duty cycle settings that achieve a desired power supply apportionment scheme for a known or predictable DC load. A distributed networked control system is derived from the central system that utilizes communications among controllers to compute a shared estimate of the unknown time-varying load through shared bus current measurements and bus voltage measurements.

20 Claims, 7 Drawing Sheets

(56) References Cited

PUBLICATIONS

Rajagopalan, J. et al; Modeling and Dynamic Analysis of Paralleled DC/DC Converters with Master-Slave Current Sharing Control, IEEE Power Electrons Specialists Conference . . . , 1996, 2 pp.

Karlsson, Per; DC Distributed Power Systems—Analysis, Design and Control for a Renewable Energy System; Doctoral Dissertation in IEE; Lund University, 2002, 200 pp.

Karlsson, Per; Jorgen, Svensson; Voltage Control and Load Sharing in DC Distribution Systems; Lund University, Dept. of industrial Electrical Engineering, 2003, 10 pp.

Balog, Robert S.; Autonomous Local Control in Distributed DC Power Systems; Univ. of Illinois—Urbana Champaign, Dept. of Electrical and Computer Engineering, 2006, 113 pp.

* cited by examiner

DISTRIBUTED CONTROL SYSTEM FOR PARALLEL-CONNECTED DC BOOST CONVERTERS

CROSS-REFERENCE TO RELATED APPLICATION

This application claims the benefit of U.S. Provisional Application No. 61/794,484 filed Mar. 15, 2013, titled DISTRIBUTED CONTROL SYSTEM FOR PARALLEL-CONNECTED DC BOOST CONVERTERS.

STATEMENT REGARDING FEDERALLY SPONSORED RESEARCH OR DEVELOPMENT

This invention was made with government support under grant number DE-AC04-94AL85000 awarded by the United States Department of Energy. The government has certain rights in the invention.

BACKGROUND OF THE INVENTION

It is difficult to apportion the power contribution of each of multiple DC power sources while maintaining a desired DC bus voltage. The present invention generally relates to a centralized controller for DC boost converters.

BRIEF SUMMARY OF THE INVENTION

The disclosed invention is a distributed control system for operating a DC bus fed by disparate DC power sources that service a known load or unknown load. The individual voltage sources vary in v-i characteristics and have maximum supply capacities that are time-varying. Each source is connected to the bus via a boost converter. The boost converters may have different dynamic characteristics and power transfer capacities, but are all controlled through PWM.

The primary problem addressed herein is to track the time-varying power sources and apportion the power contribution of each while maintaining the DC bus voltage within the specifications. A central digital controller is developed that solves the steady-state system for the optimal duty cycle settings that achieve a desired power supply apportionment scheme for a known or a predictable DC load. A distributed networked control system is then derived from the central system that utilizes communications among controllers to compute a shared estimate of the unknown time-varying load through shared bus current measurements and common (replicated) bus voltage measurements.

DETAILED DESCRIPTION

Various embodiments will be described in detail with references to drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims. It is understood that various omissions and substitutions of equivalents are contemplated as circumstances may suggest or render expedient, but these are intended to cover application or embodiments without departing from the spirit or scope of the claims attached hereto. Also, it is to be understood that the phraseology and terminology used herein are for the purpose of description and should not be regarded as limiting.

1. DC Bus Configuration

Figure 1:
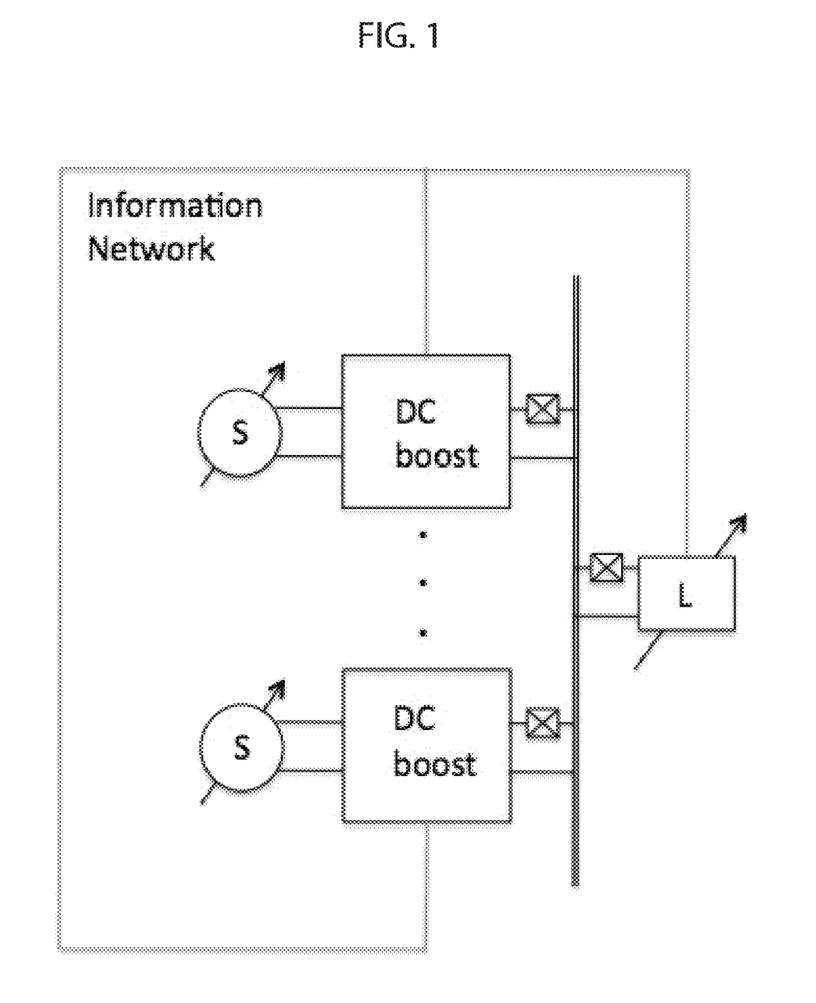
FIG. 1 illustrates one example of a boost-mediated DC bus.
Figure 2:
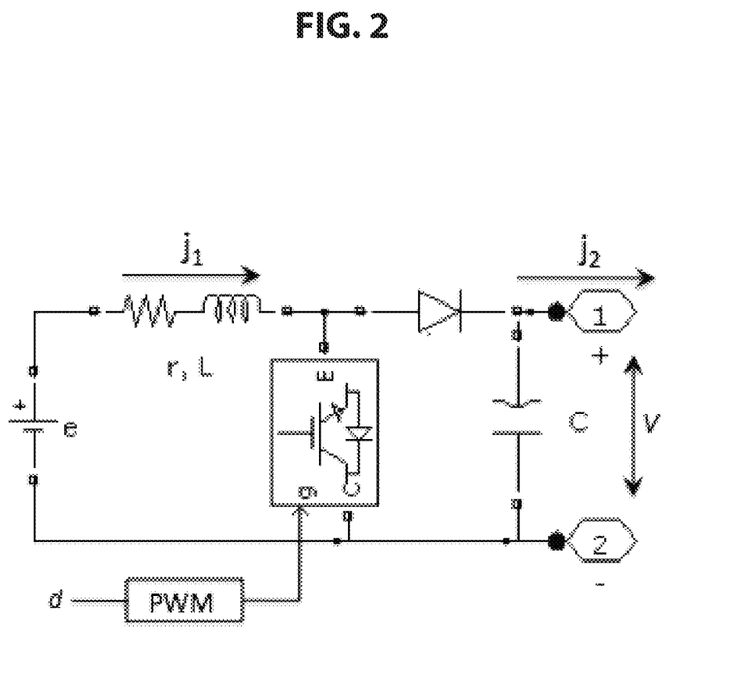
FIG. 2 illustrates one example of a boost converter circuit.
Figure 3:
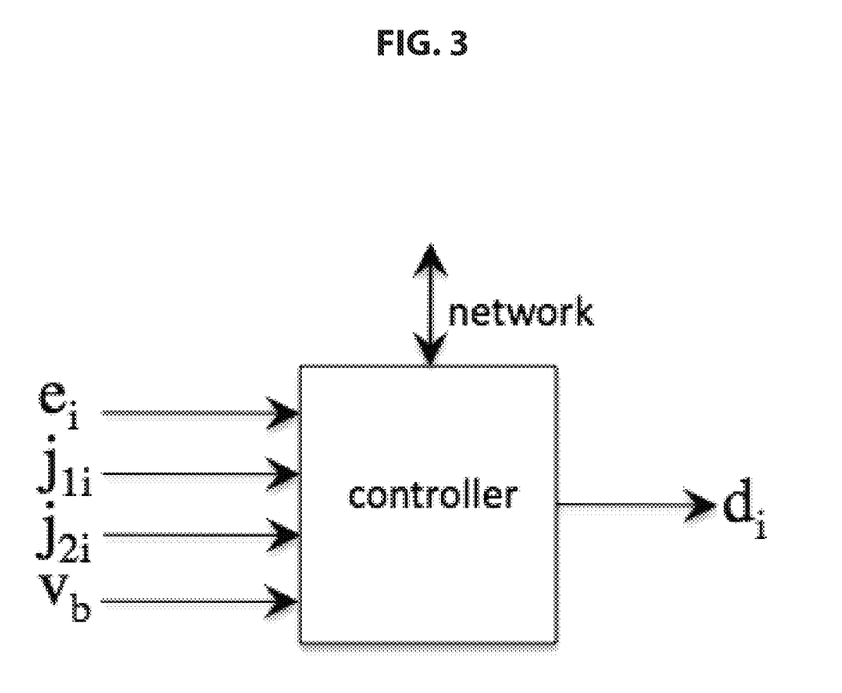
FIG. 3 illustrates one example of a networked controller.

A DC bus with a single variable load fed by multiple sources is shown in FIG. 1. Each source voltage $e_i$ is less than the bus operating voltage $v_b$ so a boost converter—FIG. 2—is used to amplify it. The converters are joined in output-parallel connections to the common bus. Each converter contains a networked controller, shown in FIG. 3, that enables communications among all converters and the load center as well. The controller measures the boost converter input voltage $e_i$, the input current $j_{1i}$, the output current $j_{2i}$, and the bus voltage $v_b$, and outputs the local PWM duty cycle $d_i$. Data is exchanged with other converters via the network connection. Depending on the particular control scheme, controllers may exchange any variety of sensor data, model data, objective function, power schedule, or external commands from operators.

1.1 Control Philosophy and PowerFlow

The general objective of any of the many possible control schemes is to maintain the bus voltage within some specified range in response to load and input voltage variations. The multiple distributed sources have time-varying power capacities, so the control scheme must also continually adjust the converter input currents to respect the changing power limits while maintaining the bus voltage. The power flow equations are:

$$P_{Source} = P_{Load} + P_{Loss} \tag{1}$$

$$P_{Source} = \sum_i P_i = \sum_i e_i j_{1i} \tag{2}$$

$$P_{Load} = v_b J_b = v_b \sum_i j_{2i} \tag{3}$$

$$P_{Loss} = \sum_i r_i j_{1i}^2 \tag{4}$$

$$\sum_i (e_i j_{1i} + r_i j_{1i}^2 + v_b j_{2i}) = 0 \tag{5}$$

Let $P_{source}^{max}$ be the instantaneous maximum power available from all sources, and $P_{si}^{max}$ be the instantaneous maximum power available from the $i^{th}$ source so:

$$P_{source}^{max} \geq P_{source} \geq P_{Load} + P_{Loss} \tag{6}$$

$$e_i j_{1i} \leq P_{si}^{max} \tag{7}$$

According to (6) the total loss plus load must never exceed the maximum available source power. If (6) is not violated, then the control problem is to properly apportion the power outputs of the boost converters according to the local constraints defined by (7) and the admissible bus voltage range. If (6) is violated, load trimming control must be implemented. We will consider only the case where (6) is an equality for now and assume that the schedules $P_{si}^{max}$ are known with certainty. Under these circumstances, the control problem involves following the source power schedule while regulating $v_b$ in response to changing input voltages and load schedule. If perfect knowledge of both source and load schedules obtains, then predicted control regimes can be calculated and control modes switched in and out accordingly. The remainder of this paper will discuss a control scheme that relies of source/load schedules and DC models of the aggregate bus dynamics.

1.2 Steady State Analysis

The average state-space system for the boost converters operating in continuous conduction mode are given by $$L_i \dot{x}_i = u_i - r_i x_i - \lambda_i x_{N+1} \quad (8)$$

$$\sum_i C_i \dot{x}_{N+1} = \sum_i \lambda_i x_i - G_o x_{N+1} \quad (9)$$

where $x_i = j_{1i}$, $x_{N+1} = v_b$, and $u_i = e_i$. Equations of the form given in (8) describe the local converter's KVL, and (9) gives the bus KCL. For the DC steady state, the LHS of (8) and (9) at zero. At steady-state the equations are:

$$e_i - r_i j_{1i} - \lambda_i v_b = 0 \quad (10)$$

$$\sum_i \lambda_i j_{1i} - G_o v_b = 0 \quad (11)$$

solving (11) and substituting into 10:

$$e_i - r_i j_{1i} - \frac{\lambda_i}{G_o} \sum_i \lambda_i j_{1i} = 0 \quad (12)$$

Let $R_o$ be $$\frac{1}{G_o},$$

so collecting terms gives:

$$e_i - r_i j_{1i} - R_o \lambda_i^2 j_{1i} - R_o \lambda_i \sum_{k \neq i} \lambda_k j_{1k} = 0 \quad (13)$$

or $$e_i - j_{1i}(r_i + R_o \lambda_i^2) - R_o \lambda_i \sum_{k \neq i} \lambda_k j_{1k} = 0 \quad (14)$$

Let $v_i = R_o \lambda_i j_{1i} = R_o j_{2i}$, and let $$v_i' = R_o \sum_{k \neq i} \lambda_k j_{1k},$$

then substitute into (14):

$$e_i - j_{1i} r_i - R_o \lambda_i^2 j_{1i} - \lambda_i v_i' = 0 \quad (15)$$

$$j_{1i} = \frac{e_i - \lambda_i v_i'}{r_i + \lambda_i^2 R_o} \quad (16)$$

When $v_i' = 0$, the other sources provide no power and $e_i > 0$ ensures $j_{1i} > 0$. When other sources are active on the bus, the input current provided by the source at voltage $e_i$ is reduced by contributions from other sources. Since the boost converters are unidirectional, $j_{1i} \geq 0$. For a positive power contribution from the source, $j_{1i} > 0$, so:

$$e_i > \lambda_i v_i' \quad (17)$$

$$e_i > \lambda_i (v_b - v_i) \quad (18)$$

Alternatively, the upper limit on $\lambda_i$ is decreased:

$$\lambda_i < \frac{e_i}{(v_b - v_i)} \quad (19)$$

So converters operating collectively will provide less current and at higher duty cycles for given $e_i$ and $v_b$ than if operating alone. If all boost stages are exactly identical and driven by the same or identical voltage sources, the "homogenous element" case, (11) becomes:

$$N \lambda j_1 - G_o v_b = 0; \quad (20)$$

$$v_b = N \lambda j_1 R_o;$$

$$j_1 = \frac{G_o v_b}{N \lambda}$$

and (10) is:

$$e - r j_1 - N \lambda^2 R_o j_1 = 0 \quad (21)$$

Solving for $j_1$ and $\lambda$:

$$j_1 = \frac{e}{r + N \lambda^2 R_o} \quad (22)$$

Generally $r \ll R_o$, so the input impedance seen by each voltage source increases by a factor of N. Each converter provides 1/N of the current that would be delivered by a single converter system.

$$\lambda = \sqrt{\frac{G_o}{N}\left(\frac{e}{j_1} - r\right)} = \sqrt{\frac{j_2}{v_b}\left(\frac{e}{j_1} - r\right)} \quad (23)$$

Since $j_b = N R_o j_2$, $\lambda$ is the same as that of a single converter. Alternatively, (21) can be substituted on j to express it in terms of $v_b$:

$$e - r \frac{G_o v_b}{N \lambda} - \lambda v_b = 0 \quad (24)$$

$$N \lambda e - r G_o v_b - N \lambda^2 v_b = 0 \quad (25)$$

Quadratic formula solution to (25) yields:

$$\lambda = \frac{1}{2Nv_b}\left(Ne + \sqrt{(Ne)^2 - 4rNG_o v_b^2}\right) \quad (26)$$

$$\lambda = \frac{1}{2v_b}\left(e + \frac{1}{\sqrt{N}}\sqrt{Ne^2 - 4rG_o v_b^2}\right) \quad (27)$$

When N=1, the solution is as expected:

$$\lambda = \frac{1}{2v_b}\left(e + \sqrt{e^2 - 4rG_o v_b^2}\right) \quad (28)$$

and if r=0, or r<<$R_o$, the familiar form appears:

$$\lambda = \frac{e}{v_b} \quad (29)$$

Recall that the maximum power available from a voltage generator with generation resistance r is:

$$P_{max} = \frac{e^2}{4r} \text{ or } e^2 = 4rP_{max} \quad (30)$$

Then (28) can be expressed as $$\lambda = \frac{1}{2v_b}\left(e + 2\sqrt{r}\sqrt{P_{max} - P_o}\right) \quad (31)$$

and (27) as $$\lambda = \frac{1}{2v_b}\left(e + \frac{2\sqrt{r}}{\sqrt{N}}\sqrt{NP_{max} - P_o}\right) \quad (32)$$

Where $P_o$ is the total bus power. The term $NP_{max}$ in (32) is the total power available from N stages. Alternatively, let $1/N = \alpha$ and substitute into (24):

$$e - r\frac{\alpha G_o v_b}{\lambda} - \lambda v_b = 0 \quad (33)$$

$$\lambda e - \alpha r G_o v_b - \lambda^2 v_b = 0 \quad (34)$$

$$\lambda = \frac{1}{2v_b}\left(e + \sqrt{e^2 - 4\alpha r G_o v_b^2}\right) \quad (35)$$

$$\lambda = \frac{1}{2v_b}\left(e + 2\sqrt{r}\sqrt{P_{max} - \alpha P_o}\right) \quad (36)$$

So (35) and (36) present the solution for $\lambda$ in terms of the fraction $\alpha$ of the total power provided to the load by a single stage. Note also that the input current for each stage can be determined by $$j_1 \frac{1}{2r}\left(e + \sqrt{e^2 - 4\alpha r G_o v_b^2}\right) \quad (37)$$

(37) indicates that the effective load seen by a single converter is $\alpha G_o$, i.e., the total load is apportioned among the collective equally. Note that in the limit $\alpha \to 0$ or $N \to \infty$, $$\lambda \to \frac{e}{v_b},$$

$j_1 \to 0$. Moreover, the total losses through all converters is $Nrj_1^2$, so since the input current $j_1$ in a collective configuration is about $j_1/N$ of the single converter configuration, the losses scale as $1/N$. This encourages a modular building-block approach based on a replicated low-power unit that can be composed in parallel to mediate higher power sources. The $\alpha$ factor can be generalized to the heterogenous collective.

1.3 Output Current Apportionment

Describe the $i^{th}$ output current as:

$$\lambda_i j_i = \alpha_i G_o v_b; \text{ where } \sum_i \alpha_i = 1 \quad (38)$$

$\alpha$ is a convex set that apportions the current supplied by each converter.

$$j_i = \frac{\alpha_i G_o v_b}{\lambda_i} \quad (39)$$

Substitute (39) into (10):

$$e_i - r_i \frac{\alpha_i G_o v_b}{\lambda_i} - \lambda_i v_b = 0 \quad (40)$$

$$\lambda_i e_i - r_i \alpha_i G_o v_b - \lambda_i^2 v_b = 0 \quad (41)$$

Solve for $\lambda_i$ by the quadratic equation:

$$\lambda_i = \frac{1}{2v_b}\left(e_i + \sqrt{e_i^2 - 4r_i \alpha_i G_o v_b^2}\right) \quad (42)$$

which is an indexed version of (35). The term $\alpha_i G_o$ is the effective (reduced) load admittance allocated to the $i^{th}$ converter. Let $$\alpha_i G_o = g_i \text{ so } \sum_i g_i = G_o \quad (43)$$

$$\lambda_i = \frac{1}{2v_b}\left(e_i + \sqrt{e_i^2 - 4r_i g_i v_b^2}\right) \quad (44)$$

So $\alpha$ is a partition of the total bus load assigned to each converter. The set $\alpha$ can also be viewed as apportioning the power output $P_{io}$ of each converter:

$$\lambda_i = \frac{1}{2v_b}\left(e_i + \sqrt{e_i^2 - 4r_i P_{io}}\right) \quad (45)$$

where $$P_{io} = \alpha_i j_b v_b \quad (46)$$

Provided the set $\alpha$ represents an admissible apportionment that respects the maximum power capacity of each individual converter for a given (known) load $G_o$, the duty cycle can updated by each converter controller according to (42) in a decentralized scheme.

Now $g_i v_b$ is the $i^{th}$ converter output current $j_{2i}$. Set $v_b$ to the desired reference voltage, $v_b = v_b^*$ and $G_o v_b^* = j_b^*$, the bus reference current, and substitute into (42):

$$\lambda_i^* = \frac{1}{2v_b^*}\left(e_i + \sqrt{e_i^2 - 4r_i \alpha_i v_b^* j_b^*}\right) \quad (47)$$

Equation (14) is a decentralized, feedforward algorithm in terms of the $i^{th}$ sensed input voltage $e_i$, the bus reference voltage $v_b^*$, the bus reference current $j_b^*$, and the $\alpha_i$ the $i^{th}$ apportionment factor. It relies on knowledge of the effective input resistance $r_i$, (generator resistance+line resistance+inductor resistance+switch resistance), and $G_o$, the total bus load. In most cases of interest, the actual value of $G_o$ is unknown and time-varying. Consequently, $j_b^*$ is also unknown. In the case of ideal homogenous collective, $$j_b = Nj_2 = Nj_{2i} \quad (48)$$

and $$G_o = \frac{j_b}{v_b} = \frac{Nj_{2i}}{v_b} \quad (49)$$

Since each converter takes an independent measurement of $v_b$, $v_{bi}$, knowledge of N−1, the number of other converters on the bus, and the local output current measurement, $j_{2i}$, provide a means to estimate $G_o$. In practice, the measurements $v_{bi}$, and $j_{2i}$ are noisy so an estimator is needed to predict $G_o$. Moreover, the converters certainly not likely to be exact replicas, so modeling errors will be uncompensated without feedback. The same holds true for an inhomegenous collective by definition. In this case the bus current $j_b$ is unknown at each converter. But the collective has distributed knowledge of the value and through a timely sharing protocol, the value of $j_b$ may be determined through the sum $$j_b = \sum_i j_{2i} \quad (50)$$

and knowledge that all converters sample and report the values synchronously. Against sampling clocks are generally out of phase and communications channels have latencies, usually uncertain, so to estimate $j_{bi}$ an estimator that accounts for the sampling jitter and communications delay (in addition to sensor noise) must be found. Moreover, all converters must arrive at the same estimate of $j_b$ close enough in time to coherently adjust their outputs while maintaining $v_b$ within specification and ensuring $j_i$ respects its specification based on equation (7). Since we also assume that load controller may have a known load schedule, it may transmit a new value for $G_o$ over the network to the converter controllers, but again the arrival at each converter is subject to uncertain communication delays and intraarrival jitter. Finally, for heterogeneous collectives, the controllers must have a protocol for arriving at the set $\alpha$.

Since the available power from a source may change according to a schedule, the collective must complete a new apportionment agreement based on some policy at each change. For now we assume the schedule consists of values for $\alpha$ with event times, i.e., a vector time sequence $$A = \{\alpha(t_1), \alpha(t_2), \ldots \alpha(t_M)\} \quad (51)$$

Each controller has a local copy of A and all controllers are synchronized to a common clock. At each time step in A the controllers pick their respective values for $\alpha_i(t_k)$ and adjust the duty cycle according to (47).

2. Development of Control Concepts

In this section we develop control concepts based on the ideal steady-state derivations of the previous section. First, a centralized control system for ideal collectives is developed. The idealizations are based on two assumptions: 1) certain and correct knowledge of model parameters; and 2) perfect synchronization of events through a global clock.

Once the performance envelope has been established for the ideal central controller, a distributed control system model is developed. The developments are guided by the use of model-based adaptive control concepts in which control agents perform computations and communications in real time. The computations involve combining sensor readings with models and optimization routines. Model structure, parameters, and optimization cost functions are shared through communications protocols at appropriate times.

Local sensor data is also shared periodically among control agents. In general, control designs are evaluated according to the frequency and amount of information sharing required, and a performance metric based on the specifications for bus voltage and converter currents. For our purposes, let the state vector be $$x = [j_{11}, j_{12}, \ldots j_{1N}, v_b] \quad (52)$$

and the desired state be x*, which are the reference values for the input currents and bus voltage. The control strategy is to track the changing reference currents and bus voltage. Usually, the bus voltage reference is constant and has a tolerance of $\pm \Delta v_b$, but variations in bus voltage are possible with model-based controls.

For now assume the bus voltage is regulated and the input currents are tracked. The goal is to respond in real time to disturbances in the load, $G_o$, and the input voltage vector e, and to changes in power apportionment policy summarized in the convex set $\alpha$.

Apportionment policy must always respect the changing limits to source power capacity, but may impose other factors within those bounds based on reliability, ramp-up time, economic and environmental factors, and other considerations. This requires reasoning about the specifics of the source generators, and involves defining a preferred mix of generation through cost functions and a subsequent optimization that determines $\alpha$ over a given epoch.

2.1 General State-Space Model

Figure 4:
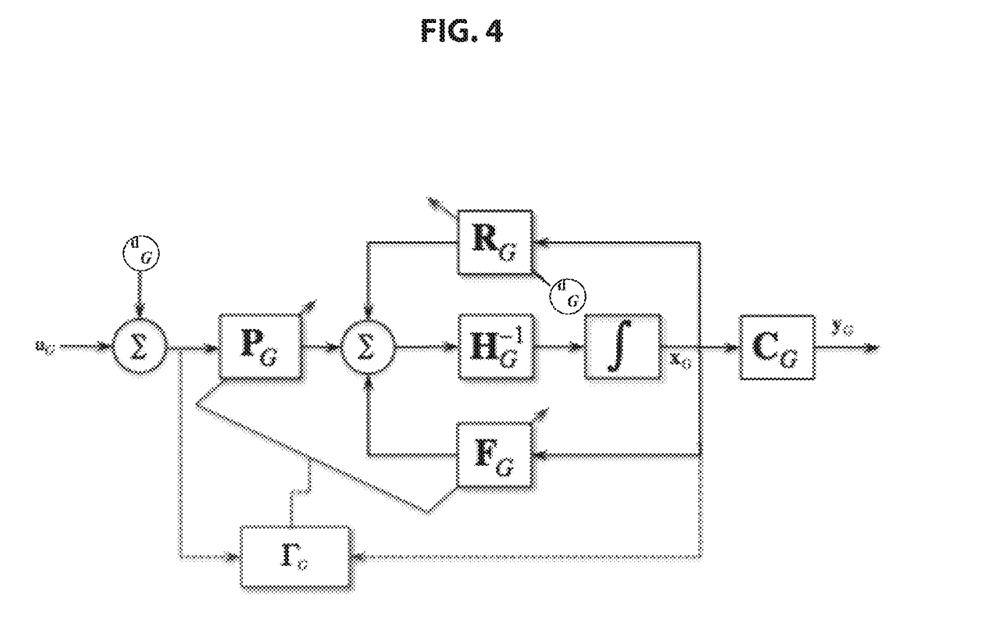
FIG. 4 illustrates one example of a general state space model.

A general state space model for the system and controller is given in FIG. 4. There are four system matrices representing the energy storage components, $H_G$, (inductors and capacitors), dissipation, $R_G$, (resistors), state feedback, $F_G$, (duty cycles as $\lambda$), and input gains, $P_G$, (voltage gains). The control system, represented by $\Gamma_G$, changes the state feedback matrix components of $F_G$, which are $\lambda$, and the voltage gains of $P_G$, which is unity for boost converters but contains duty cycles for buck converters.

The state equations for a bus with N converters are $$H_G \dot{x} = (F_G - R_G)x + P_G U \quad (53)$$

$$A_G = H_G^{-1}(F_G - R_G) \quad (54)$$

$$B_G = H_G^{-1} P_G \quad (55)$$

$$\dot{x} = A_G x + B_G u, y = C_G x \quad (56)$$

where $H_G$ and $R_G$ are diagonal matrices of size N+1, $F_G$ is a skew symmetric matrix of size N+1, $P_G$ is a N+1 diagonal, and the input voltage vector u ($e_i$) is an N×1 vector. The last row and column of the system is occupied by the DC bus equation.

The elements of the system matrices are $$H_G = \begin{bmatrix} L_1 & & & \\ & L_2 & & \\ & & L_N & \\ & & & C_T \end{bmatrix}$$

where $L_i$ is the $i^{th}$ inductor, and $C_T = \Sigma C_i + C_b + \Sigma C_g$, i.e., sum of converter output capacitances, native bus capacitance, $C_b$, and the sum of load capacitances, $\Sigma C_g$. The dissipation matrix represents the losses from the converters and the total load admittance on the bus, where $$R_G = \begin{bmatrix} r_1 & & & \\ & r_2 & & \\ & & r_N & \\ & & & G_o \end{bmatrix}$$

$G_o = \Sigma G_i + G_b$, the total of all individual conductances that are directly connected to the bus, including any native bus conductance. The state feedback matrix is a skew-symmetric $$F_G = \begin{bmatrix} & & & -\lambda_1 \\ & & & -\lambda_2 \\ & & & -\lambda_N \\ \lambda_1 & \lambda_2 & \lambda_N & 0 \end{bmatrix}$$

matrix with element values of $\lambda_i$. The input gain matrix $P_G$, is an identity matrix if all source converters are boost converters. Otherwise it has 1 s for boost converter entries and duty cycle settings for buck converters. The control vector u is $$P_G = \begin{bmatrix} 1 & & & \\ & 1 & & \\ & & 1_N & \\ & & & 1 \end{bmatrix}$$

composed of the source voltages and an auxiliary current source or load, $j_3$, applied directly to the bus. If $j_3$ is negative, it represents a current sink, otherwise it's a $$u = \begin{bmatrix} e_1 \\ e_2 \\ e_N \\ j_3 \end{bmatrix}$$

current source, enabling multi-bus interconnections. Recall the state vector is given by (52) and consists of the source currents and the bus voltage. The output vector is the vector $$x = \begin{bmatrix} j_{11} \\ j_{12} \\ j_{1N} \\ v_b \end{bmatrix}$$

of individual converter output currents, the bus voltage, and the total bus current. The controller $$y = \begin{bmatrix} j_{21} \\ j_{22} \\ j_{2N} \\ v_b \\ j_b \end{bmatrix}$$

$$C_G = \begin{bmatrix} \lambda_1 & & & & \\ & \lambda_2 & & & \\ & & \lambda_N & & \\ & & & 1 & \\ 1 & 1 & 1 & & 0 \end{bmatrix}$$

$\Gamma_G$ measures x, y, and u, and outputs $F_G$ and $P_G$: it essentially adapts $A_G$ and $B_G$ and as such is an adaptive state feedback and adaptive gain controller. However, because they represent average duty cycles for PWM-based control, physical limits on the values of $F_G$ constrain entries to $0 \leq f_{ij} \leq 1$. The values of $f_{ij}$ constrain the eigenvalues of the system.

The controller selects the $A_G$ matrix (and $B_G$ if buck converters are used to mediate higher voltage sources) in equation (56), to move the state $x(t_k)$ to the desired reference state $x^*(t_{k+1})$ as determined by the model calculations, in response to the disturbances in input voltage u and load. Load disturbances manifest in the $G_o$ parameter of the $R_G$ matrix, so the system is linear time-varying (LTV), but is LTI between load disturbances and control interventions.

The steady state equations corresponding to equation (53) are $$(F_G - R_G)x + P_G u = 0 \quad (57)$$

$$u = P_G^{-1}(R_G - F_G)x \quad (58)$$

$$x = (R_G - F_G)^{-1} P_G u \quad (59)$$

so for a known load ($R_G$ is fixed), known duty cycles ($F_G$ is fixed), and for $x = x^*$, the input vector ($[ej_3]$) can be computed from (58). Alternatively, the state x can be computed from known load, duty cycles and input voltages from equation (59).

2.2 General Controller Architecture

Figure 5:
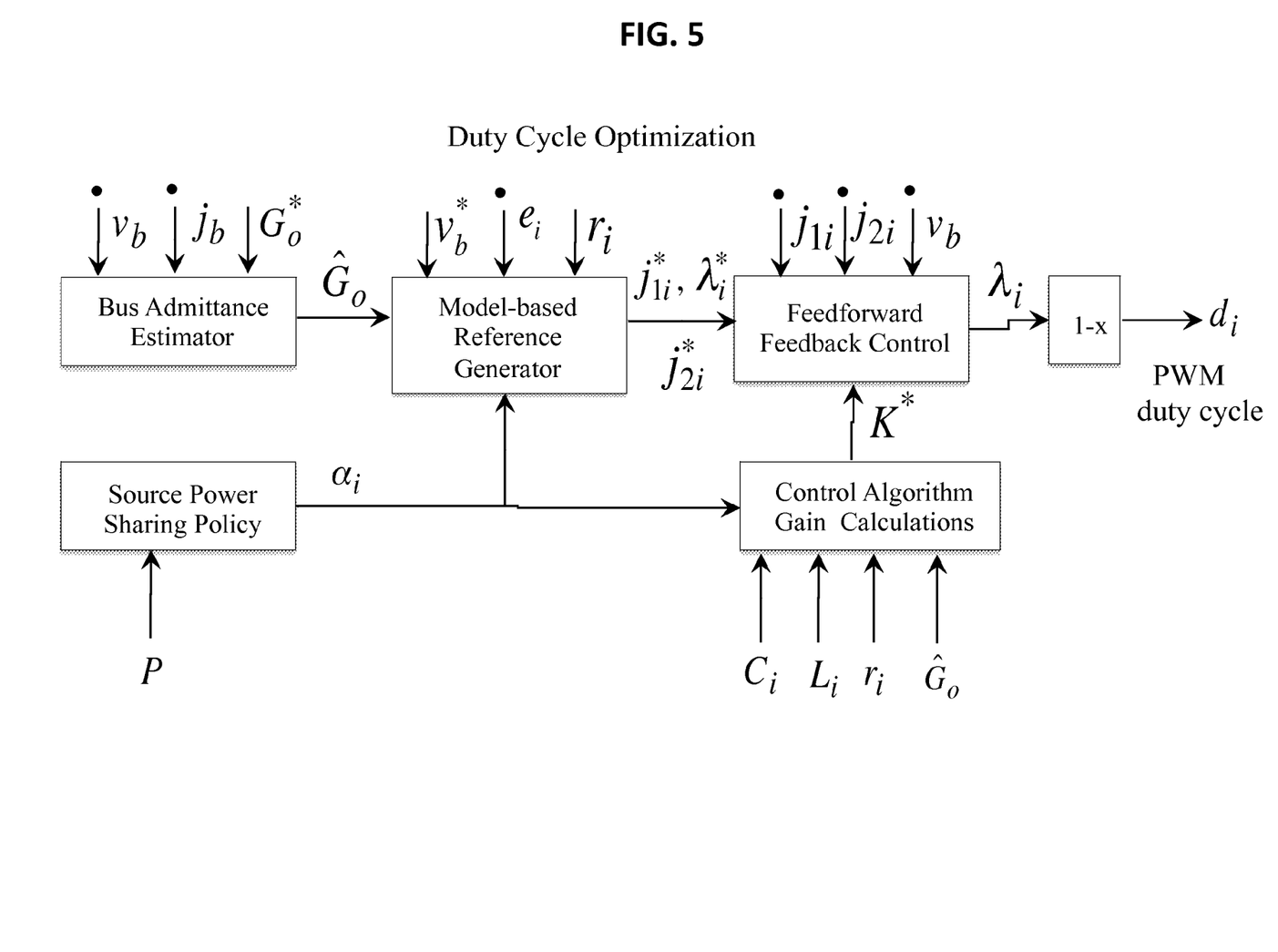
FIG. 5 illustrates one example of a $\Gamma_G$ controller architecture.

FIG. 5 shows a general architecture for the central controller $\Gamma_G$. A Load Power Sharing Policy module computes a new value for the vector α asynchronously according to a load apportionment policy. Changes to α can occur asynchronously and continuously. The bus load is estimated from bus voltage and bus current measurements by the Bus Load Estimator ($\hat{G}_o$), or from a predicted or scheduled value provided directly by the load controller ($G_o^*$).

The Model-Based Reference Generator computes steady-state values for the input and output current references $j_{1i}^*$, $j_{2i}^*$, and/or the duty cycle reference $\lambda_i^*$, for use in direct or closed loop control algorithms. The module takes as inputs the bus voltage reference $v_b^*$, input voltage measurements, loss resistances $r_i$, and the load conductance, $\hat{G}_o$. The Model-Based Reference Generator can implement any decentralized or distributed optimization calculation, or equations (27), (44) or (47).

Reference value for the state variables are provided to feedforward/feedback control loops that measure the converters' states and output the duty cycle commands. Values for the duty cycles can also be fed directly to the PWM actuators in an open-loop feedforward control scheme. Gains for discrete control algorithms are calculated by the Control Algorithm Gain Calculation module. $K^*$ is a vector of gain values for generalized PID control loops. Values of converter inductance, input resistance, capacitance (FIG. 2), and load $\hat{G}_o$ can be used for tuning the PID loops.

2.3 Steady-State Feedforward Controller

Figure 6:
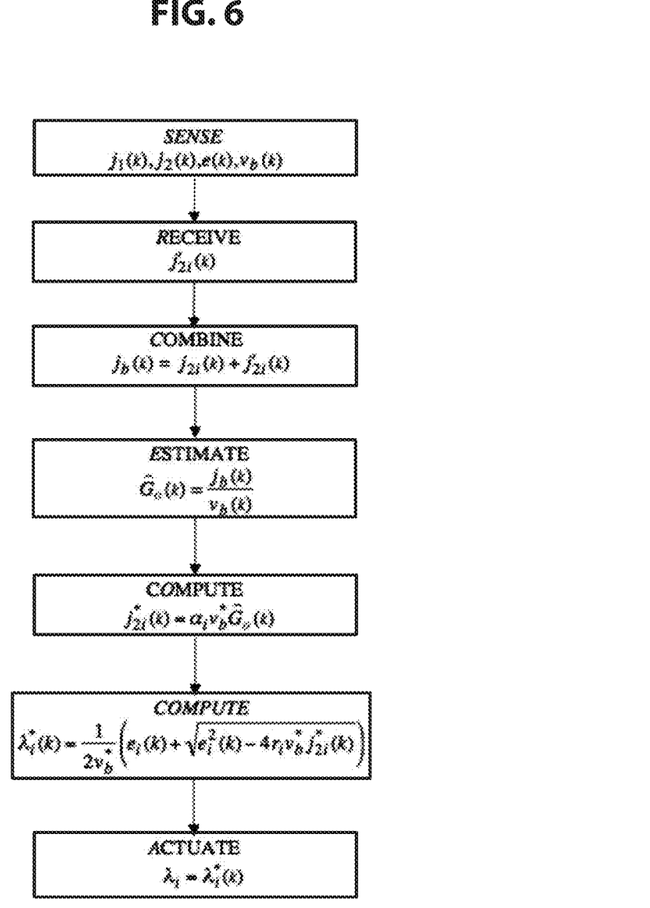
FIG. 6 illustrates one example of a $\Gamma_G$ flowchart.

FIG. 6 shows a flowchart for a model-based steady-state implementation of the controller $\Gamma_G$. This algorithm computes the optimal value for the duty cycles that respect the apportionment values $\alpha$, but estimates the changing load conductance $G_o$ and responds to changing input voltages. The prime formula in this version is given by (47):

$$\lambda_i^*(k) = \frac{1}{2v_b^*}\left(e_i(k) + \sqrt{e_i^2(k) - 4r_i v_b^* j_{2i}^*(k)}\right) \quad (58)$$

The estimate of the local output current reference $j_{2i}^*$ in (58) can be determined from the local measurement of $j_{2i}(k)$ by $$j_{2i}^*(k) = v_b^* \alpha_i \hat{G}_o(k) = v_b^* \hat{g}_i(k) = v_b^* \frac{j_{2i}(k)}{v_b(k)} \quad (59)$$

Control agents can also share current measurements on each control cycle through a network protocol to obtain $j_b(k) = \Sigma j_{2i}(k)$ and obtain $\hat{j}_{2i}(k) = \alpha_i j_b(k)$. This approach requires high-tempo communications but can compensate for different converter dynamics by ensuring a common basis for current apportionment at each control cycle.

Each control agent estimates its apportioned load conductance (or current) based on the agreed-upon set $\alpha$, resulting in power contributions from each converter/source in proportion to $\alpha$ at steady state. The apportionment set $\alpha$ must be updated according to power sharing protocols conducted by all generation control agents when source power capacity changes require a new generation power flow operating point, but operation is decentralize during intervals of constant $\alpha$.

The Source Power Sharing Policy determines $\alpha$ from an interactive agreement protocol based on the optimal power capacity envelope $P^*$, which is a time-varying quantity that captures natural variations in generation power in sources such as wind and solar, preferences for reducing fuel consumption and/or $CO_2$ emissions from fossil-fueled sources, etc.

2.4 Adaptive Cascade PI Controller

Note that if the DC boost converters have different dynamics, individual compensators are needed to adjust the transient performance of the system in response to changes in load and input voltage. In some cases, estimation errors and the differing dynamics may prevent settling to the proper steady state apportionments. The "$\alpha$" strategy apportions the common lead among converters. However, power sources are limited by their respective power envelopes and may have variable losses, requiring apportionment of the power input of each boost converter.

Figure 7:
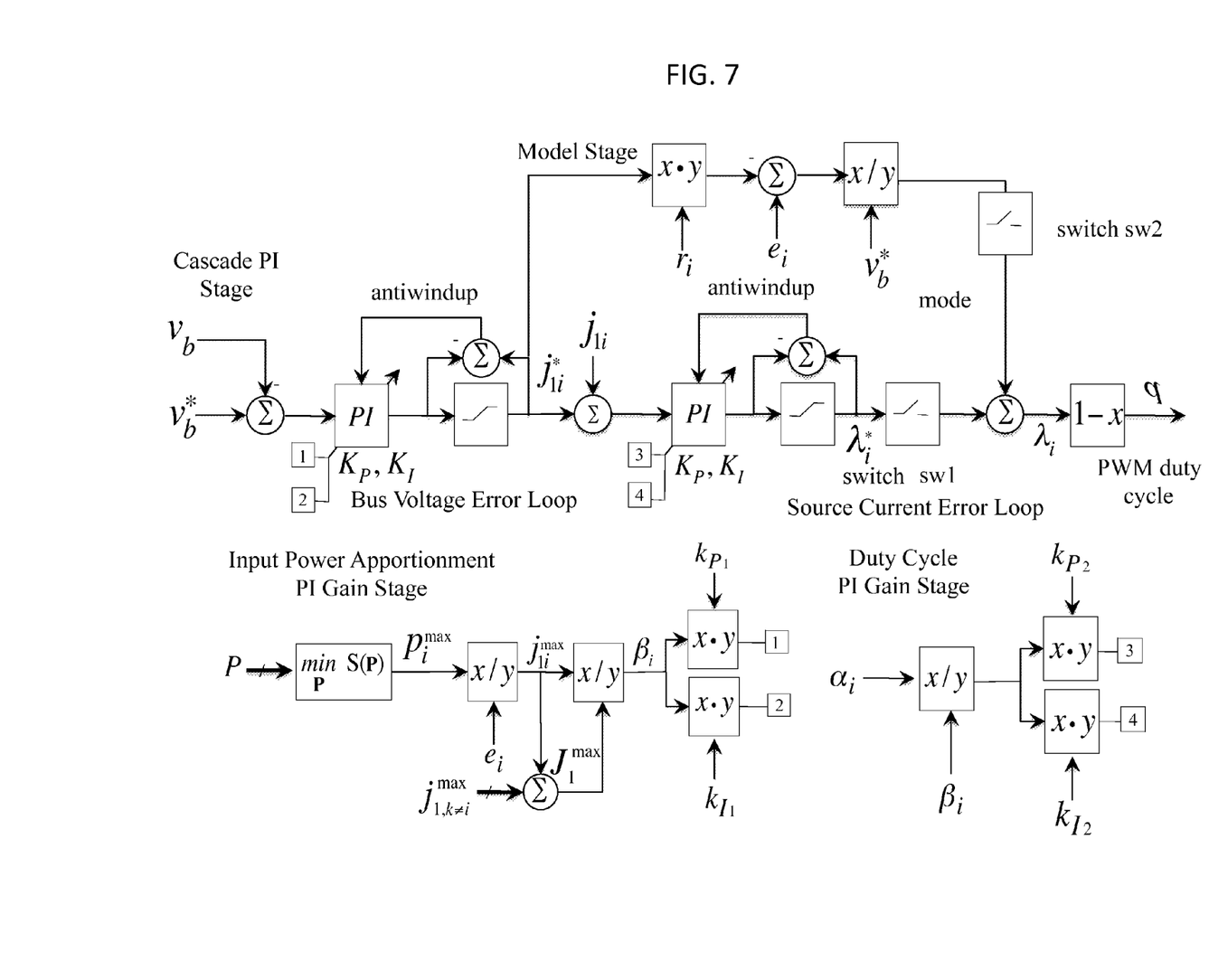
FIG. 7 illustrates one example of an adaptive cascade PI controller.

FIG. 7 shows an adaptive cascade PI control architecture that allows apportionment of the input power according to a source power schedule. The theory of operation behind this control scheme is to apportion the input power according to an optimal input power schedule from each source (generator).

An optimization and scheduling protocol is conducted among source and load control agents to obtain a maximum power schedule, $P = \{P_1^{max}(t), P_2^{max}(t), \ldots P_N^{max}(t)\}$ for each source based on efficiency, reliability, fuel usage, $CO_2$ emissions, availability of variable sources (wind and solar), and other considerations. From the $P_i^{max}$ value for the current epoch, the maximum input current $j_{1i}^{max}$ is found by dividing by the input voltage measurement for the current control cycle.

The $j_{1i}^{max}$ values are shared over the network whenever one or more changes, and a proportion $$\beta_i = \frac{j_{1i}^{max}}{\Sigma j_{1i}^{max}}, \Sigma \beta_i = 1 \text{ (convex set)} \quad (60)$$

is computed. This provides a proportional gain in analogy to $\alpha_i$ for bus load apportionment, but applied to the input current.

The $\beta_i$ parameter computed by the Input Power Apportionment PI Gain Stage—FIG. 7) scales a conventional cascade PI loop stage (Cascade PI Stage—FIG. 7) that uses the common bus voltage $v_b$ measurement and the bus voltage reference $v_b^*$ to provide a common error signal to each controller (Bus Voltage Error Loop—FIG. 7). The error signal is fed to a PI stage to generate an individual input current reference $j_{1i}^*$.

Controllers share gains $K_{P1}$ and $K_{I1}$, so the $i^{th}$ controller in the Laplace domain obeys $$v_b^*(s) - v_b(s) = E_v(s) \quad (61)$$

$$E_v(s)\beta_i\left(K_{P_1} + \frac{K_{I_1}}{s}\right) = j_{1i}^*(s) \quad (62)$$

Hence the input current reference signals remain in proportion throughout time in response to the common bus voltage error. The gains $K_{P_1}$ and $K_{I_1}$ can be chosen to adjust the loops for stability, settling time, and overshoot. The sampled current measurement $j_{1i}$ is subtracted from $j_{1i}^*$ to obtain a current error signal for a subsequent PI stage that outputs a value for $1-\lambda_i(d_i)$, the duty cycle.

The current reference $j_{1i}^*$ is also fed into a feed-forward Model Stage (FIG. 7) that computes the ideal steady-state value for $\lambda_i$ from the source voltage measurement $e_i$, input resistance and bus voltage reference $v_b^*$. Mode switches SW1 and SW2 allow mixed modes among feedforward and dual-loop control. The second PI loop (Source Current Error Loop) has gains $K_{P_2}$ and $K_{I_2}$ that are scaled by parameters that hold the proportions of duty cycles to $$\lambda_i = \frac{\alpha_i}{\beta_i} \quad (63)$$

in one form of the adaptive gain strategy for converging duty cycles in unison.

There are many variations on the theme for the controller architecture of FIG. 5. Note that the Adaptive Cascade PI Controller is an instance of the more general $\Gamma_G$ architecture. The $\Gamma_G$ architecture accepts many different schemes for power schedule optimization, power apportionment, feed-forward and feedback controllers, model-based controllers, and adaptive controllers.

I claim:

1. A method for managing a plurality of direct-current (DC) boost converters, the plurality of DC boost converters being output parallel-connected to a bus having a bus voltage, each of the plurality of DC boost converters receiving power input from a corresponding source, the power input having an input voltage and an input current, each of the plurality of DC boost converters having a controller communicatively networked to all other controllers of all others of the plurality of DC boost converters, the method comprising:
   each controller of a plurality of DC boost converters measuring an input voltage and an input current from its corresponding source;
   each controller of the plurality of DC boost converters communicatively sharing with all other controllers of all others of the plurality of DC boost converters quantities relating to:
      a power operating point of its corresponding source, wherein the power operating point is the maximum instantaneous available power from the corresponding source;
      the measured input voltage from its corresponding source; and
      the measured input current from its corresponding source;
   each controller of the plurality of DC boost converters determining a pulse-width modulation duty cycle for its DC boost converter via an adaptive cascade PI control architecture, wherein the adaptive cascade PI control architecture includes an input power apportionment PI gain stage, further wherein the adaptive cascade PI control architecture includes input parameters of the measured input voltage and the measured input current of its corresponding source, an actual bus voltage, and a desired bus voltage; and
   each DC boost converter operating in accordance with the pulse-width modulation duty cycle determined by its controller.

2. The method of claim 1, wherein the method elements of measuring, communicatively sharing, determining a pulse-width modulation duty cycle, and operating in accordance with the pulse-width modulation duty cycle, are repeated.

3. The method of claim 1, wherein for each controller, the input power apportionment PI gain stage determines a desired operating current for its corresponding source, the method further comprising each controller communicatively sharing the desired operating current for its corresponding source with all other controllers of all others of the plurality of DC boost converters.

4. The method of claim 3, wherein the input power apportionment PI gain stage of the adaptive cascade PI control architecture includes:
   calculating a $\beta$ value that is a quotient of the desired operating current for its corresponding source divided by a sum of all desired operating currents for all corresponding sources of all controllers of all of the plurality of DC boost converters;
   calculating a proportional gain coefficient that is a product of the $\beta$ value and a nominal proportional gain coefficient; and
   calculating an integral gain coefficient that is a product of the $\beta$ value and a nominal integral gain coefficient,
   wherein the proportional gain coefficient and the integral gain coefficient are applied to a bus voltage error loop.

5. The method of claim 4, wherein the adaptive cascade PI control architecture can be selectively switched to include only one of a duty cycle PI gain stage or a feed-forward model stage.

6. The method of claim 5, wherein:
   the adaptive cascade PI control architecture is switched to include the duty cycle PI gain stage; and
   the duty cycle PI gain stage includes:
      calculating an $\alpha$ value that is a partition of a total bus load assigned to its DC boost converter;
      calculating another proportional gain coefficient that is a product of a quotient $\alpha/\beta$ and another nominal proportional gain coefficient; and
      calculating another integral gain coefficient that is a product of the quotient $\alpha/\beta$ and another nominal integral gain coefficient; and
   wherein the another proportional gain coefficient and the another integral gain coefficient are applied to a source current error loop.

7. The method of claim 6, wherein the $\alpha$ value is determined via an interactive agreement protocol conducted among all the controllers of all of the plurality of DC boost converters.

8. The method of claim 5, wherein:
   the adaptive cascade PI control architecture is switched to include the feed-forward model stage; and
   the feed-forward model stage includes model-based determination of a complement of the pulse-width modulation duty cycle based upon the desired bus voltage, the measured input voltage from its corresponding source, and an estimated equivalent input resistance.

9. The method of claim 4, further comprising overriding the calculating of the $\beta$ value and setting the $\beta$ value to unity.

10. The method of claim 1, wherein the input power apportionment PI gain stage includes a minimization of a power cost function, the power cost function taking as input the quantities relating to power operating points from all controllers of all of the plurality of DC boost converters, the minimization of the power cost function returning an actual power operating point for its corresponding source.

11. The method of claim 10, wherein the power cost function to be minimized is the same for each controller.

12. The method of claim 10, wherein the power cost function factors in the availability of wind power from a corresponding source of at least one of the plurality of DC boost converters.

13. The method of claim 10, wherein the power cost function factors in the availability of solar power from a corresponding source of at least one of the plurality of DC boost converters.

14. The method of claim 10, wherein the power cost function penalizes $CO_2$ emissions.

15. A power system, comprising:
a direct current (DC) bus having a bus voltage;
a plurality of DC power sources;
a plurality of DC boost converters, wherein each DC boost converter couples a corresponding one of the plurality of DC power sources to the DC bus, each DC boost converter having a controller;
an information network communicatively coupling all of the controllers of the DC boost converters,
wherein the controller of each DC boost converter is programmed and configured to:
measuring an input voltage and an input current from its corresponding source;
communicatively share with all other controllers of all others of the plurality of DC boost converters, via the information network, quantities relating to:
a power operating point of its corresponding source, wherein the power operating point is the maximum instantaneous available power from the corresponding source;
the measured input voltage from its corresponding source; and
the measured input current from its corresponding source; and
determine a pulse-width modulation duty cycle for its DC boost converter via an adaptive cascade PI control architecture, wherein the adaptive cascade PI control architecture includes a input power apportionment PI gain stage, further wherein the adaptive cascade PI control architecture includes input parameters of the measured input voltage and the measured input current of its corresponding source, an actual bus voltage, and a desired bus voltage; and
wherein each DC boost converter operates in accordance with the pulse-width modulation duty cycle determined by its controller, wherein each DC boost converter receives an input voltage and an input current from its corresponding DC power source and outputs an output current to the DC bus at the bus voltage.

16. The system of claim 15, wherein each controller is programmed and configured such that the input power apportionment PI gain stage determines a desired operating current for its corresponding source, and each controller is programmed and configured to communicatively share the desired operating current for its corresponding source with all other controllers of all others of the plurality of DC boost converters.

17. The system of claim 16, wherein each controller is programmed and configured such that the input power apportionment PI gain stage of the adaptive cascade PI control architecture includes:
calculating a $\beta$ value that is a quotient of the desired operating current for its corresponding source divided by a sum of all desired operating currents for all corresponding sources of all controllers of all of the plurality of DC boost converters;
calculating a proportional gain coefficient that is a product of the $\beta$ value and a nominal proportional gain coefficient; and
calculating an integral gain coefficient that is a product of the $\beta$ value and a nominal integral gain coefficient,
wherein the proportional gain coefficient and the integral gain coefficient are applied to a bus voltage error loop.

18. The system of claim 17, wherein each controller is programmed and configured such that the adaptive cascade PI control architecture can be selectively switched to include only one of a duty cycle PI gain stage or a feed-forward model stage;
further wherein the duty cycle PI gain stage includes:
calculating an $\alpha$ value that is a partition of a total bus load assigned to its DC boost converter;
calculating another proportional gain coefficient that is a product of a quotient $\alpha/\beta$ and another nominal proportional gain coefficient; and
calculating another integral gain coefficient that is a product of a quotient $\alpha/\beta$ and another nominal integral gain coefficient; and
wherein the another proportional gain coefficient and the another integral gain coefficient are applied to a source current error loop; and
still further wherein the feed-forward model stage includes model-based determination of a complement of the pulse-width modulation duty cycle based upon the desired bus voltage, the measured input voltage from its corresponding source, and an estimated equivalent input resistance.

19. A method for managing a plurality of direct-current (DC) boost converters, the plurality of DC boost converters being output parallel-connected to a bus having a bus voltage, each of the plurality of DC boost converters receiving power input from a corresponding source, the power input having an input voltage and an input current, each of the plurality of DC boost converters having a controller communicatively networked to all other controllers of all others of the plurality of DC boost converters, the method comprising:
each controller of a plurality of DC boost converters measuring an input voltage and an input current from its corresponding source;
each controller of the plurality of DC boost converters communicatively sharing with all other controllers of all others of the plurality of DC boost converters quantities relating to:
a power operating point of its corresponding source, wherein the power operating point is the maximum instantaneous available power from the corresponding source;
the measured input voltage from its corresponding source; and
the measured input current from its corresponding source;
each controller of the plurality of DC boost converters determining a pulse-width modulation duty cycle for its DC boost converter via an adaptive cascade PI control architecture,
wherein the adaptive cascade PI control architecture includes input parameters of the measured input voltage and the measured input current of its corresponding source, an actual bus voltage, and a desired bus voltage;
wherein the adaptive cascade PI control architecture includes an input power apportionment PI gain stage, the input power apportionment PI gain stage including:
determining a desired operating current for its corresponding source, with each controller communicatively sharing the desired operating current for its corresponding source with all other controllers of all others of the plurality of DC boost converters;

calculating a β value that is a quotient of the desired operating current for its corresponding source divided by a sum of all desired operating currents for all corresponding sources of all controllers of all of the plurality of DC boost converters;

calculating a proportional gain coefficient that is a product of the β value and a nominal proportional gain coefficient; and calculating an integral gain coefficient that is a product of the β value and a nominal integral gain coefficient, wherein the proportional gain coefficient and the integral gain coefficient are applied to a bus voltage error loop;

wherein the adaptive cascade PI control architecture can be selectively switched to include only one of a duty cycle PI gain stage or a feed-forward model stage, wherein:

the duty cycle PI gain stage includes:
calculating an α value that is a partition of a total bus load assigned to its DC boost converter;
calculating another proportional gain coefficient that is a product of a quotient α/β and another nominal proportional gain coefficient; and calculating another integral gain coefficient that is a product of a quotient α/β and another nominal integral gain coefficient; and wherein the another proportional gain coefficient and the another integral gain coefficient are applied to a source current error loop; and the feed-forward model stage includes model-based determination of a complement of the pulse-width modulation duty cycle based upon the desired bus voltage, the measured input voltage from its corresponding source, and an estimated equivalent input resistance; and each DC boost converter operating in accordance with the pulse-width modulation duty cycle determined by its controller, wherein the elements of measuring, communicatively sharing, determining a pulse-width modulation duty cycle, and operating in accordance with the pulse-width modulation duty cycle, are repeated.

20. The method of claim 19, wherein the input power apportionment PI gain stage includes a minimization of a power cost function, the power cost function taking as input the quantities relating to power operating points from all controllers of all of the plurality of DC boost converters, the minimization of the power cost function returning an actual power operating point for its corresponding source.

* * * * *